(12) United States Patent
Aleshin et al.

(10) Patent No.: US 6,934,410 B1
(45) Date of Patent: Aug. 23, 2005

(54) MASK CORRECTION FOR PHOTOLITHOGRAPHIC PROCESSES

(75) Inventors: Stanislav V. Aleshin, Moscow (RU); Marina M. Medvedeva, Moscow (RU); Eugeni E. Egorov, Moscow (RU); Gennady V. Belokopytov, Moscow (RU); Paul G. Filseth, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 737 days.

(21) Appl. No.: 09/879,664

(22) Filed: Jun. 12, 2001

(51) Int. Cl.$^7$ .............................................. G06K 9/00
(52) U.S. Cl. ....................... 382/144; 382/173; 382/266; 382/274; 355/53; 430/5; 716/19
(58) Field of Search ............................... 382/144, 266, 382/274, 283, 305, 176; 356/68; 378/34; 310/320; 367/140; 716/4, 19, 21, 20; 355/55, 355/52, 53; 430/5

(56) References Cited

U.S. PATENT DOCUMENTS 6,611,953 B1 * 8/2003 Filseth et al. .................. 716/19

* cited by examiner

Primary Examiner—Bhavesh M. Mehta
Assistant Examiner—Sheela Chawan
(74) Attorney, Agent, or Firm—Westman, Champlin & Kelly (57) ABSTRACT

Local images of photolithographic masks are assigned to classes based on similarity of functions of circuits formed by the images, so that all of the images of a class can be corrected by correcting one of the members. Boundaries of photolithographic masks are corrected for diffusion of light by moving regions based on process light intensity and proximity of close connections. Boundaries are also corrected for shifting of photoactive material in photoresists by calculating the amount of shift based on light intensities at pattern points.

28 Claims, 3 Drawing Sheets

MASK CORRECTION FOR PHOTOLITHOGRAPHIC PROCESSES

FIELD OF THE INVENTION

This invention relates to electronic chip fabrication, and particularly to correction of masks used in photolithographic processes to fabricate chips.

BACKGROUND OF THE INVENTION

Thin film integrated circuits (ICs), commonly called "chips" or "IC chips", are fabricated by a photolithographic process by which a photolithographic mask is positioned adjacent a substrate, such as a wafer, for adding features to or subtracting features from the substrate. Thus, each mask defines a layer of material to be added to, or removed from, the substrate. Typically, the mask is used with another material, such as a photoresist, which is exposed by light through the photographic mask to define the feature being formed on the substrate to form the chip. The photoresist is then developed to define the feature, and the feature is then deposited onto, or etched from, a layer on the substrate forming the chip.

The density of features on a chip is, in part, limited by the size of the photographic image on the mask, as well as the ability of the photoresist to accurately reproduce the feature defined by the photographic image. However, light waves through the mask are often distorted through the mask when patterning the photoresist. Moreover, the photoresist itself may diffuse during the photolithographic process, thereby inaccurately reproducing the features on the mask. Hence, either or both light diffraction and photoresist diffusion adversely affects the resulting shapes of features on the substrate.

A technique known as optical proximity correction (OPC) permits compensation for distortion due to diffraction of light waves by altering the photographic image into a shape so that it will form the correct shape of the feature on the substrate. Using OPC, the features formed on the substrate may be smaller and more closely packed (dense) without forming breaks or shorts in the circuitry.

However, OPC techniques are time consuming and expensive, particularly for masks for fabricating chips with hundreds of thousands, or even millions, of gates. In such circumstances OPC can only be applied to local regions of the mask; it is not possible to apply OPC to all areas of a mask simultaneously. Consequently, it has been necessary to apply OPC techniques to multiple regions of the mask independently, and resolve conflicts across region bounds separately. Moreover, application of OPC became repetitive where the chip includes numerous copies of the same or similar circuit.

Accordingly, there is a need for an improved technique to form shapes on a mask that, when light diffracts through the mask, accurately reproduces the desired shape for the feature on the substrate. There is also a need for an improved technique that permits assigning local images of the mask to classes with other similar local images, and performing OPC on the class to derive mask correction for all local images of the class. There is also a need for a reliable technique to identify photoresist diffusion to correct mask boundaries.

SUMMARY OF THE INVENTION

In a first embodiment a photolithographic mask is designed by defining an uncorrected mask having at least one boundary that define a boundary of a feature on a substrate of the IC. A position of the process light intensity is identified relative to the mask boundary. The mask boundary is segmented into a plurality of regions, and a distance $\Delta$ is calculated normal to the boundary of each region between its midpoint and the position of the process light intensity. The mask boundary within the region is moved a distance $\Delta'$ based on the calculated distance $\Delta$ and whether a close connection exists relative to the respective region.

In a second embodiment, a plurality of local images of corrected mask boundaries are defined such that each local image has a function. A plurality of classes of local images are defined such that each class has a similar function set. A local image to be inserted into a class is selected and its function is identified. The function of the selected local image is compared to the function set of a class of local images, and the selected local image is assigned to a class.

In a third embodiment, the selected local image is decomposed into a set of oriented segments defining its function. A difference is computed between the selected local image function and a function of a local image of one of the classes.

In a fourth embodiment, the photolithographic mask is corrected for diffusion of the photoactive compound of the photoresist defining a plurality of first pattern points along a first axis normal to a boundary of the mask defining the feature. A light intensity due to the process light intensity is identified at each process point. A diffusion shift of the photoresist is calculated based on the light intensities at each pattern point, and the mask boundary is shifted a distance along the first axis based on the diffusion shift.

In one form of the fourth embodiment, a plurality of second pattern points are defined along a second axis parallel to the boundary. The diffusion shift is calculated by calculating first and second subsidiary values based on the light intensities at each first and second pattern point. The diffusion shift is calculated based on the first and second subsidiary values and a parameter of diffusion of the photoresist.

In preferred embodiments, the process is carried out in a computer using computer readable program code that models the mask and light intensities and generates computer definitions of corrected masks for use in the photolithographic process.

DETAILED DESCRIPTION OF THE PREFERRED EMBODIMENTS

A first embodiment of the invention concerns rapid approximation of the correction of mask boundaries or edges by moving sections of the edge between nodes based on light intensity and proximity to other mask boundaries. This aspect of the invention is best illustrated in FIG. 1, which illustrates the process of moving a boundary segment 10, and FIG. 2, which is a flow chart of the process of this aspect of the invention.

Figure 1:
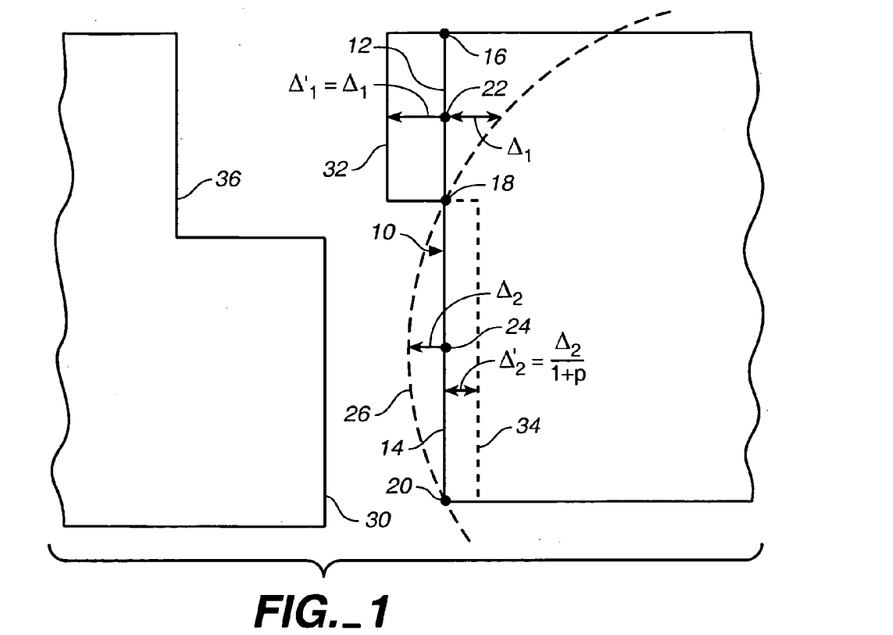
FIG. 1 is a diagram of a mask feature useful for demonstrating a first embodiment of the present invention.

As shown in FIG. 1, each boundary segment 10 is divided into a plurality of regions 12 and 14. Each region is part of boundary segment 10 and has x,y coordinates at its beginning and its end nodes. Region 12 has a beginning node 16 and an end node 18, and region 14 has a beginning node 18 and an end node 20. During mask correction, each region may move in a direction perpendicular to the segment length to correct the mask geometry.

Figure 2:
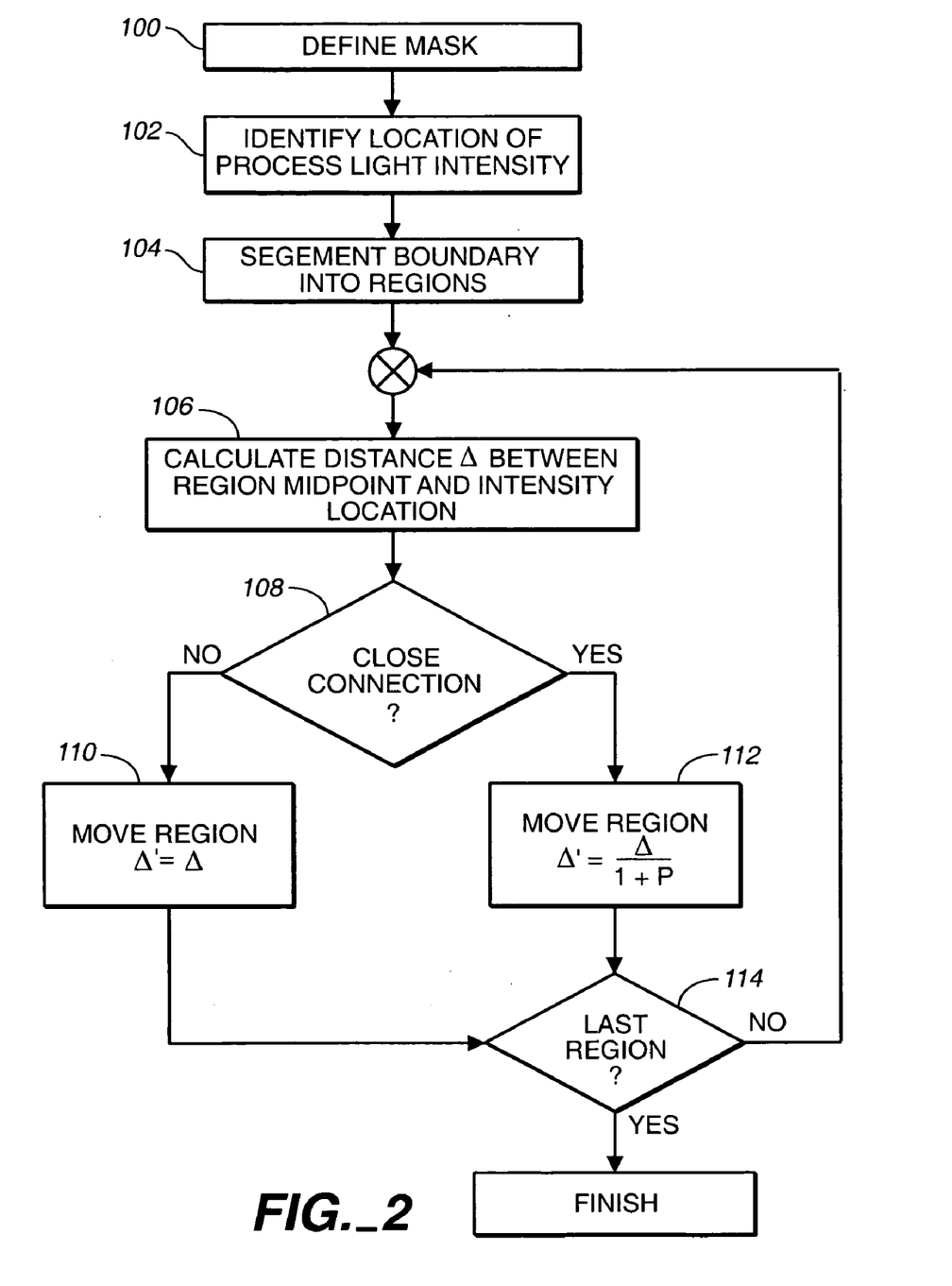
FIG. 2 is a flow diagram illustrating the steps of the process of the first embodiment of the invention.

At step 100 in FIG. 2, an uncorrected mask is defined with boundaries matching the desired boundaries of features to be formed on a substrate in a photolithographic process. However, these features may be distorted during the photolithographic process due to light diffraction and/or diffusion of the photoresist image, resulting in feature boundaries on the substrate that doe not match those of the uncorrected mask. At step 102, the light intensity of the photolithographic process is identified, and its first derivative is calculated at the wafer plane defined by boundary 10 (FIG. 1) based on the current mask geometry. The light intensity is in the form of a matrix of intensities, relative to boundary 10. A plot of the process light intensity is represented by light intensity curve 26 in FIG. 1. At step 104, the boundary is segmented into a plurality of regions 12 and 14 having nodes 16, 18 and 20. The nodes selected for the regions are the coarsest permitted by the model to thereby minimize the time required for mask correction. Center points 22 and 24 are identified for each region 12 and 14.

The light intensity between the nodes can be approximated by a curve of the third order to obtain the intensity values at the center points 22 and 24 of each region as the sum:

$$I(x, y) = I(M, N) + \frac{\partial I}{\partial x}(M, N) \cdot dx + \frac{\partial I}{\partial y}(M, N)dy + \frac{\partial^2 I}{\partial x^2}(M, N)(dx)^2 +$$

$$\frac{\partial^2 I}{\partial y^2}(M, N)(dy)^2 + \frac{\partial^2 I}{\partial x \partial y}(M, N)dxdy + \frac{\partial^3 I}{\partial x^3}(M, N)(dx)^3 +$$

$$\frac{\partial^3 I}{\partial y^3}(M, N)(dy) + \frac{\partial^3 I}{\partial x^2 \partial y}(M, N)dx^2 dy + \frac{\partial^3 I}{\partial x \partial y^2}(M, N)dxdy^2,$$

where $$M = \left[\frac{x}{\text{delta } X}\right],$$

$$N = \left[\frac{y}{\text{delta } Y}\right],$$

dx=x−(delta X)·M, dy=y−(delta Y)·N, and delta X and delta Y are distances between nodes 16, 18 and 20 in the x and y directions, respectively.

At step 106, a distance $\Delta$ is calculated between the center point 22, 24 of each region 12, 14 and the position of the process intensity level normal to the boundary (on curve 26). The distance $\Delta$ is identified based on the approximation of curve 26. Next, the region is moved a distance $\Delta'$ normal to its length from its center point until the intensity at the center point reaches the process light intensity level (i.e., curve 26 is contiguous the center point).

At step 108, the region is considered with respect to any close connections. More particularly, at step 108, if design rules require that the region under consideration must maintain a physical association with another feature, such as feature 30 (FIG. 1), that region is identified as having a "close connection". As used herein, a "close connection" is a mask feature that must be maintained within some maximal distance of the region under consideration, or one that must be at least some minimal distance from the region under consideration. If the region does not have a close connection (that is, there are no other mask features that must be within some maximal distance of the region, or that must be at least some minimal distance from the region), at step 110 the region is moved a distance $\Delta$ necessary to change, and thereby correct, the mask for light diffraction and/or photoresist distortion (i.e., $\Delta'=\Delta$). If the region has a close connection such that movement of the boundary at the region by the distance $\Delta$ would cause a design violation, at step 112 the region is moved by an amount $\Delta'=\Delta/(1+P)$, where P is a design constant, to maintain region movement within the allowed distance.

For example, in FIG. 1, $\Delta_1$ is the distance between the center point 22 of region 12 and curve 26 in a direction normal to boundary 10, and $\Delta_2$ is the distance between the center point 24 of region 14 and curve 26. There is no mask feature of close connection to region 12, but mask feature 30 must be maintained within some maximal distance of region 14. $\Delta_1'$ and $\Delta_2'$ are the distances that regions 12 and 14 will actually be moved. Since there is no constraint on movement of region 12, $\Delta_1'=\Delta_1$, and region 12 moves a distance $\Delta_1$ to position 32. However, region 14 cannot move the full distance $\Delta_2$, so region 14 moves $$\Delta_2' = \frac{\Delta_2}{1+P}$$

to position 34. Consequently, $$\Delta_2' = \frac{\Delta_2}{1+P}$$

and $\Delta_1=\Delta_1$ are the changes of the region amplitude for the region 14 with a close connection and for the region 12 without a close connection, respectively.

Clearly, instead of requiring the region under consideration to be within some maximal distance of the close connection, as described in connection with region 14 and feature 30, the requirement might be that a region be at least some minimal distance of the close connection. For example, if region 12 must be maintained within some minimal distance from feature 36, movement of region 12 to position 32 might create a design rule violation, in which case, the region 12 is moved $$\Delta_1' = \frac{\Delta_1}{1+P}.$$

The value of P is selected as the amount of movement adjustment for close connections. Hence, the mask is corrected from its initial geometry to its moved stepped geometry. At step 114, a determination is made as to whether all regions have been corrected, and if they have, the process ends. Otherwise, the process loops back to step 104 to repeat steps 104–112 until the mask is completed.

One problem of mask correction is that OPC can only be applied locally. In an embodiment of the present invention, a large mask is divided into a set of smaller local pictures (LPs) to create classes of geometrically similar LPs; each consisting of a set of boundaries. One LP, such as a central LP (CLP) from each class is then corrected.

Figure 3:
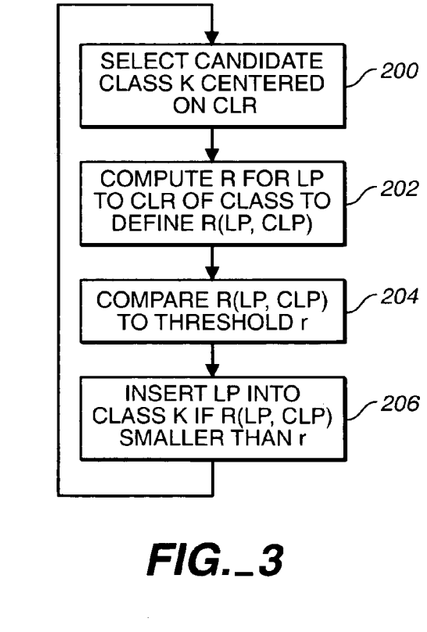
FIG. 3 is a flow diagram illustrating the steps of a process of a second embodiment of the invention.

FIG. 3 is a flow chart of a process of defining and correcting classes of LPs according to a second embodiment of the present invention. Each class K is formed around a single CLP so that each LP of each class K has a value R(LP,CLP) that represents the difference between the function of the LP and the CLP. This difference is described as a distance. The R(LP,CLP) of each LP of class K has a value that is smaller than a constant r, which is a threshold of functional variation permitted between the LPs of the class. Hence, any differences in the functions of the LPs to the CLP making up the class K are smaller than constant r, so that the LPs and CLP of class K are identical, or so similar that they may be considered identical, for purposes of mask correction.

At step 200 a class K is selected having a CLP with a known function. At step 202, a functional distance R is computed for the LP under consideration to define R(LP, CLP) as the functional difference between the LP and the CLP of the class. Each value of R is computed by geometrically subtracting two images LP of the class and then calculating the square of the difference. The value of R(LP, CLP) represents the difference between the function of the LP under consideration and the CLP to which it is compared. At step 204, the value of R(LP,CLP) is compared to constant r, which is the threshold permitted for the LPs of the class.

The process of step 204 is iteratively repeating for all LPs of the class to derive the solution of R(LP,CLP). At step 206, if r>R(LP,CLP), the LP is inserted into the class is a potential class. If r≦R(LP,CLP), the process repeats for a new class K. The process ends with the LP under consideration being inserted into the class K where the value of R(LP,CLP) for the LP under consideration is smaller than r.

Figure 4:
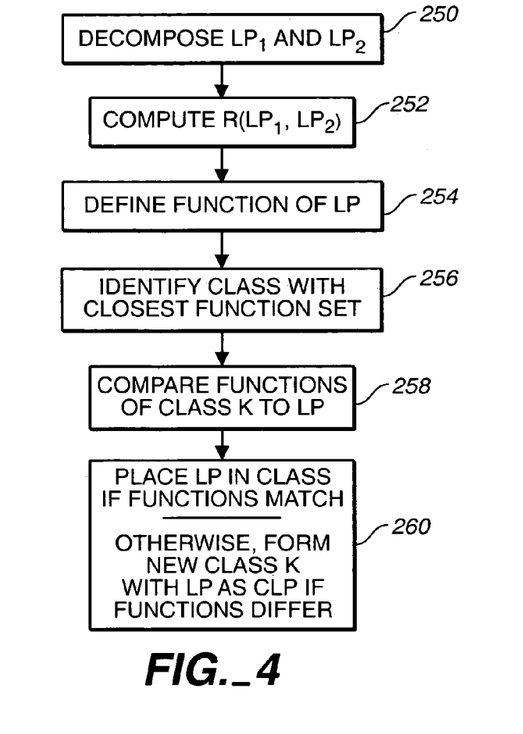
FIG. 4 is a flow diagram illustrating the steps of a process of a third embodiment of the invention, which is an alternative to the second embodiment.

FIG. 4 is a flow diagram of another process of defining and correcting classes of LPs according to a third embodiment of the present invention. At step 250, two LPs to be compared are decomposed into a set of non-overlapping primitive geometrical shapes, such as triangles and rectangles. At step 252, using such a decomposition the oriented boundary of each LP is decomposed into set SA (arrow decomposition) of oriented segments (arrows), from which R(LP1,LP2) is computed as $$R(LP1, LP2) = \sum_{A_i \in SA2} \mathrm{Dist}(A_i, SA1) + \sum_{A_j \in SA1} \mathrm{Dist}(A_j, SA2).$$

where SAi is arrow decomposition of LPi, and Dist(A, SA) between an arrow A and a set SA of arrows is a distance from A to the closest arrow from Dist(Beg(A1), Beg(A2))+Dist (End(A1), End(A2). The distance is symmetric, that is R(LP1,LP2)=R(LP2,LP1).

A given LP may be placed into an existing relevant one of a plurality of classes Ki=K(CLPi), or a new class may be created with LP as a center. Instead of computing R(LP, CLPi) for all CLPs, at step 254 a function F is defined (class invariant), so that if, for all LPs of a class centered on a given CLP, |F(LP)−F(CLP)|>e, then R(LP,CLP)>r. Under these circumstances, F is easier to compute than R. Several such functions are defined lying above, below, to the left and/or to the right of 0. Examples of such functions include a plurality of long arrows, and a square of the part of LP. All functions are weighted to ensure application of |F(LP)−F(CLP)| for all LPs.

At step 256, the list of classes is scanned for the class of closest function set, for example by using a binary search method. At step 258, the functions of the located class K are compared to those of the LP under consideration. If the functions of closest found class K (having a center CLP) differ more than a predetermined threshold from those of investigated LP, a new class is created at step 260 using the investigated LP as the CLP for the new class. Otherwise, at step 260, the distance R is computed for the LP in the found class.

In the embodiments of FIGS. 3 and 4, mask correction is performed on one member of each class, and is applied to all members. Correction may be performed upon creation of the class (such as by correcting the CLP upon creation of the class), in which case existing corrections are applied to each new LP entering the class. Alternatively, correction may be applied after creating all classes, in which case corrections are made to one member (such as the CLP) and applied to all members of the class. The embodiment of FIG. 4 is preferred because the difference function F can be calculated more quickly than distance R.

The photolithographic mask is used to pattern features onto a photoresist layer on the substrate of the IC chip being fabricated. More particularly, a layer of photoresist is formed on the substrate. The photolithographic mask is positioned adjacent the photoresist layer, and the photoresist is exposed to light through the light-transmitting portions of the mask. The photoresist is baked, causing the photoresist to flow to spread so that rough side walls are smoothed out by diffusion. The photoresist is then washed to remove or dissolve either the exposed or unexposed regions of the photoresist (depending upon whether the photoresist is a positive or negative photoresist). The completed photoresist layer forms a photoresist mask defining a pattern of features to be deposited onto, or etched from, the IC chip under construction.

During the post-exposure baking of the photoresist, molecules of the photoactive compound diffuse within the photoresist. The features of the lithographic image that were patterned into the photoresist are spread due to diffusion of the photoactive compound. The diffusion spreading causes variations in the position of the borders of the lithographic image, which are lines of constant concentration of the photoactive molecules corresponding to the illumination intensity level $I_{ref}$, before diffusion. A fourth embodiment of the invention concerns correction of the diffusion distortions in the photoresist.

The present invention treats each curved side wall of the photolithographic mask as if it were an infinite series of infinitesimally small edges. The concentration distribution relationship of $$\frac{1}{2}[1 + \Phi(x/S_{dif})]$$

Figure 5:
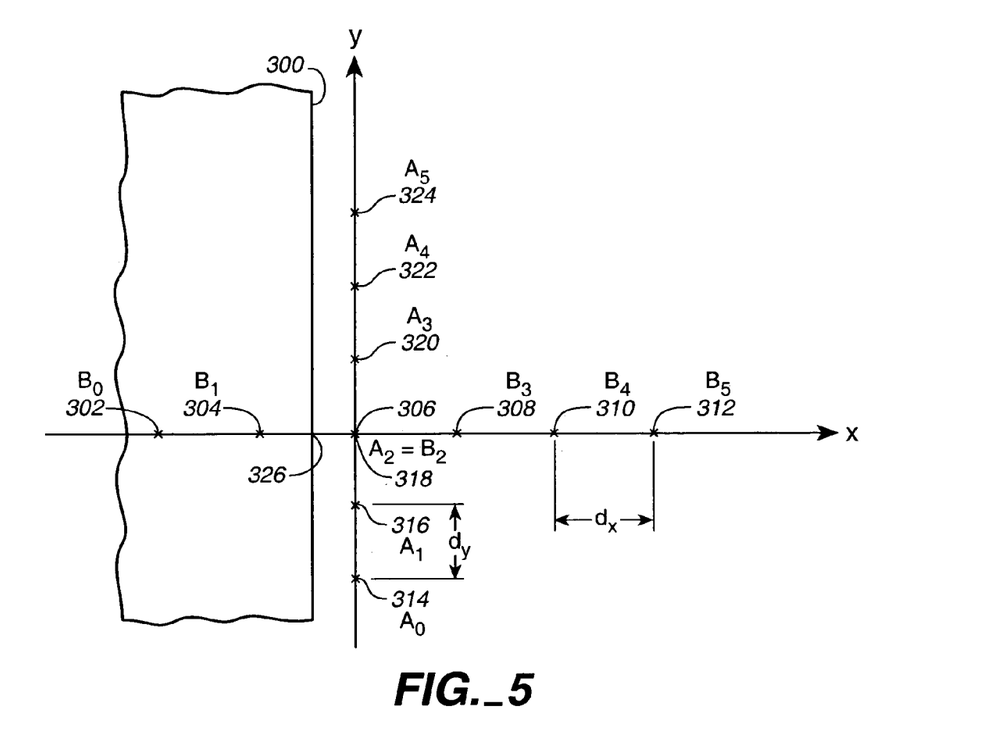
FIG. 5 is a diagram of a mask feature useful for explaining a fourth embodiment of the present invention.

(where $$\Phi(z) = \int_0^z e^{-z^2} dz$$

is the error integral function, and $S_{dif}$ is the diffusion spreading parameter) can be applied to each edge and the result summed to approximate the actual curve. The position of each edge of the photolithographic mask is corrected by shifting the edge by a distance equal to the amount of the diffusion shift of the photoresist in a direction opposite the direction of diffusion shift. The amount of the diffusion shift δx is determined as a function of the initial distribution of the light intensity given at several points at standard positions in the vicinity of the center of segment under correction. This embodiment is best illustrated in FIG. 5 and described in the process flow chart of FIG. 6.

The distance of the diffusion shift of the photoresist is calculated for each mask boundary using a plurality of pattern points along the boundary of the mask. FIG. 5 illustrates a mask boundary 300 having an x-axis normal to the boundary with the positive direction of the axis extending into the feature. A y-axis extends parallel to the boundary. A plurality of pattern points 302 . . . 312 are equally spaced a distance $d_x$ along the x-axis and a plurality of pattern points 314 . . . 324 are equally spaced a distance $d_y$ along the y-axis. The x- and y-axes intersect adjacent the center 326 of boundary 300 a distance of $d_x/2$ from the boundary.

Figure 6:
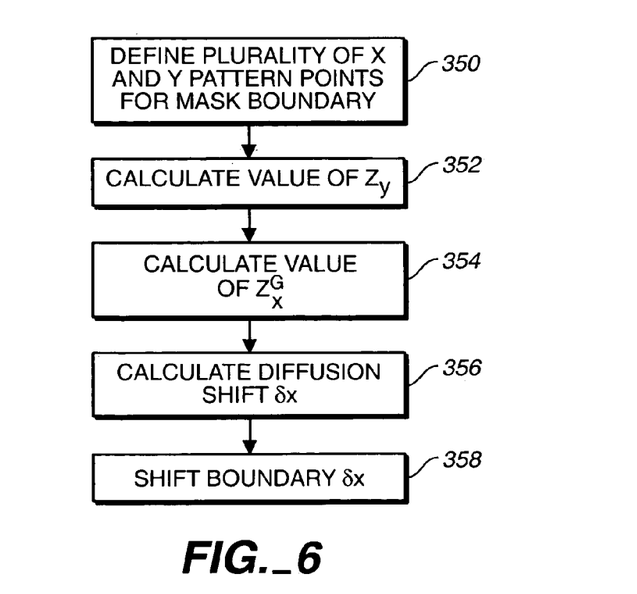
FIG. 6 is a flow diagram illustrating the steps of the process of the fourth embodiment of the invention.

At step 350, the x and y pattern points 302 . . . 0.312 and 314 . . . 324 are selected. At step 352, subsidiary values are calculated for $z_y$ and $\eta$ as $$z_y = \frac{2}{\sqrt{f_1 - f_2}}$$

and $\eta = f_1(z_y)^2 - 1$, where $$f_1 = \frac{D_1}{C_1 - I_{bgy}}$$

and $$f_2 = \frac{D_3}{C_3 - I_{bgy}}.$$

$I_{bgy}$ is calculated as a positive root of square equation $A_y I^2_{bgy} - b_y I_{bgy} + c_y = 0$, where $a_y = D_1 + D_3 - 2D_2$, $b_y = D_1(C_2 + C_3) + D_3(C_1 + C_2) - 2D_2(C_1 + C_3)$ and $c_y = D_1 C_2 C_3 + D_3 C_1 C_2 - 2D_2 C_1 C_3$.

The values $C_1$, $C_2$, $C_3$ and $D_1$, $D_2$, $D_3$ are represented in terms of intensity samplings at pattern points 314 . . . 324, as $$C_1 = \frac{9}{16}(A_2 + A_1) - \frac{1}{16}(A_3 + A_0),$$

$$C_2 = \frac{9}{16}(A_3 + A_2) - \frac{1}{16}(A_4 + A_1)$$

and $$C_3 = \frac{9}{16}(A_4 + A_3) - \frac{1}{16}(A_5 + A_2);$$

and $$D_1 = \frac{9}{8}(A_2 - A_1) - \frac{1}{24}(A_3 - A_0),$$

$$D_2 = \frac{9}{8}(A_3 - A_2) - \frac{1}{24}(A_4 - A_1)$$

and $$D_3 = \frac{9}{8}(A_4 - A_3) - \frac{1}{24}(A_5 - A_2),$$

where $A_0$ . . . $A_5$ are the light intensity values of the lithographic process at pattern points 314 . . . 324.

It will be appreciated that each of the values $C_1$, $C_2$, $C_3$ is a weighted average of the light intensities due to the process light intensity at each of pattern points 314 . . . 324. For example, the value $C_1$ is ⅛th greater than the average intensity between points 316 and 318 minus ⅛th the intensity between points 314 and 320. Each of the values $D_1$, $D_2$, $D_3$ is a weighted difference of the light intensity due to the process light intensity at each of pattern points 314 . . . 324. For example, the value of $D_1$ is ⅛th the difference in intensities over a distance $d_y$ between points 316 and 318 minus ¹⁄₂₄th the difference in intensities over a distance $3d_y$ between points 314 and 320.

At step 354, a second set of subsidiary values are calculated for $$z_x^G,$$

$$\zeta^G,$$

$$I_{bg}^G$$

as $$z_x^G = \frac{2}{\sqrt{g_1 - g_2}},$$

$$\xi^G - f_1(z_x^G)^2$$

and $I^G_{bg}$ is the positive root of square equation $$a_x(I^G_{bg})^2 - b_x I^G_{bg} + c_x = 0,$$

where $$g_1 = \frac{G_1}{F_1 - I^G_{bg}},$$

$$g_2 = \frac{G_3}{F_3 - I^G_{bg}}$$

and $\Delta_x G_1 + G_3 - 2G_2$, $b_x = G_1(F_2+F_3)+G_3(F_1+F_2)-2G_2(F_1+F_3)$ and $c_x = G_1 F_2 F_3 + G_3 F_1 F_2 - 2G_2 F_1 F_3$.

The values $F_1$, $F_2$, $F_3$ are weighted averages, and $G_1$, $G_2$, $G_3$ are weighted differences, of intensity samplings $B_0 \ldots B_5$ (FIG. 5) at pattern points 302 ... 312, as $$F_1 = \frac{9}{16}(B_2 + B_1) - \frac{1}{16}(B_3 + B_0),$$

$$F_2 = \frac{9}{16}(B_3 + B_2) - \frac{1}{16}(B_4 + B_1)$$

and $$F_3 = \frac{9}{16}(B_4 + B_3) - \frac{1}{16}(B_5 + B_2);$$

and $$G_1 = \frac{9}{8}(B_2 - B_1) - \frac{1}{24}(B_3 - B_0),$$

$$G_2 = \frac{9}{8}(B_3 - B_2) - \frac{1}{24}(B_4 - B_1)$$

and $$G_3 = \frac{9}{8}(B_4 - B_3) - \frac{1}{24}(B_5 - B_2).$$

Alternative values are calculated for $\zeta^E$ and $$z^E_x$$

are calculated as $$\xi^E = \frac{1 - 3L}{1 - L}$$

and $$z^E_x = \sqrt{\frac{1 - \xi^E}{L_0}},$$

where $L_0 = \ln(G_1 G_2)$, $L_1 = \ln(G_2/G_3)$ and $L = L_0/L_1$.

At step 356, the shift due to diffusion $\delta x$ is calculated based on the resulting values of $$z^G_x$$

and $z_y$, as a) if $d_y z_y > 3S_{dif}$ and $$d_x z^G_x > 3S_{dif}$$

(case CE), $\delta x = d_x z_x (r_x - 1) \hat{\Phi}(2/R_1 - 1)$;

b) if $d_y z_y > 3S_{dif}$ and $$d_z z^G_x < 3S_{dif}$$

(case CG), $$\delta x = d_x z_x \sqrt{L^*} \left[ \sqrt{1 - \frac{\ln(r_x)}{L^*}} - 1 \right];$$

c) if $d_y z_y > 3S_{dif}$ and $$d_x z^G_x > 3S_{dif}$$

(case GE), $\delta x = d_x z_x [r_x \hat{\Phi}(2r_y/R_1 - 1) - \hat{\Phi}(2/R_1 - 1)]$;

d) if $d_y z_y > 3S_{dif}$ and $$d_x z^G_x < 3S_{dif},$$

(case GC), $$\delta x = d_x z_x \sqrt{L^*} \left[ r_x \sqrt{1 - \frac{\ln(r_x r_y)}{L^*}} - 1 \right].$$

In the above equations $\hat{\Phi}(z)$ is the inverse error integral function, $$R_I = \frac{I_{max}}{I_{ref} - I_{bg}},$$

$$L^* = \ln(R_1),$$

$$r_x = \sqrt{1 + \left(\frac{s_{dif}}{d_x z_x}\right)^2},$$

$$r_y = \sqrt{1 + \left(\frac{s_{dif}}{d_y z_y}\right)^2}$$

and the amounts $I_{max}, I_{bg}, z_x$ are different, depending on the case a) for case CE, $$I_{max} = \sqrt{\pi} z_x F_1 \exp\left[\left(\frac{\xi}{2z_x}\right)^2\right],$$

$$I_{bg} = F_1 - \frac{1}{2} I_{max}\left[1 + \Phi\left(-\frac{\xi}{2z_x}\right)\right],$$

$$z_x = z_x^E$$

and $\zeta = \zeta^E$;

b) for case CG, $$I_{max} = (F_1 - I_{bg})\exp\left[\left(\frac{\xi}{2z_x}\right)^2\right],$$

$$\zeta = \zeta^G,$$

$$z_x = z_x^G$$

and $$I_{bg} = I_{bg}^G;$$

c) for case GE, $$I_{max} = I_{mid}\exp\left[\left(\frac{\eta}{2z_y}\right)^2\right],$$

$$I_{mid} = \sqrt{\pi} z_x F_1 \exp\left[\left(\frac{\xi}{2z_x}\right)^2\right],$$

$$I_{bg} = F_1 - \frac{1}{2} I_{mid}\left[1 + \Phi\left(-\frac{\xi}{2z_x}\right)\right],$$

$$z_x = z\frac{E}{x}$$

and $\zeta + \zeta^E$;

d) for case GG, $$I_{max} = (F_1 - I_{bg})\exp\left[\left(\frac{\xi}{2z_x}\right)^2 + \left(\frac{\eta}{2z_y}\right)^2\right],$$

$$\xi = \xi^G,$$

$$z_x = z_x^G$$

and $$I_{bg} = I_{bg}^G.$$

At step 338, the mask edge 300 is shifted by the calculated value δx.

In preferred embodiments, the invention is carried out by a computer operating under the control of computer readable program code that models the mask based on computer generated layouts of the chip and models the light intensities based on the light intensity of the process. The program code causes the computer execute on data associated with the mask and light intensity models to select pattern points and segment the mask boundaries to perform the computations of the various steps of the processes, and to compute moved positions of mask boundaries. As a result, electronic versions of corrected masks are generated for use in the lithographic process.

The present invention provides a variety of techniques for correcting photolithographic masks to adjust for diffraction of light, diffusion of the photoresist, and to classify local pictures of the mask into classes for quicker and easier mask correction. The techniques are effective and may be used to approximate mask corrections for photolithographic processes.

Although the present invention has been described with reference to preferred embodiments, workers skilled in the art will recognize that changes may be made in form and detail without departing from the spirit and scope of the invention.

What is claimed is:

1. A process of designing a mask for use in a photolithographic process to form a predetermined feature on a substrate using a process light intensity, the process comprising steps of:
   a) defining a mask for use in the photolithographic process, wherein the mask has at least one boundary matching a boundary of the feature;
   b) identifying a location of the process light intensity relative to the mask boundary;
   c) segmenting the mask boundary into a plurality of regions, each region having a midpoint;
   d) calculating a distance $\Delta$ normal to the boundary in each region between the respective region midpoint and the location of the process light intensity;
   e) identifying if a close connection exists relative to the respective region; and
   f) for each region, moving the region a distance $\Delta'$ based on the distance $\Delta$ calculated in step (d) and the identification in step (e).

2. The process of claim 1, wherein step (f) includes, for each region, steps of:
   f1) moving the mask boundary within the region by $\Delta$ if a close connection is not found to exist at step (e); and
   f2) moving the mask boundary within the region by $\Delta/(1+P)$ if a close connection is found to exist at step (e).

3. The process of claim 1, further including steps of:
   g) defining a plurality of local images of mask boundaries, each local image having a function;
   h) defining a plurality of classes of local images having similar function sets;
   i) identifying a function associated with a selected local image;
   j) comparing the function of the selected local image to the function set of a class of local images; and
   k) assigning the selected local image to a class based on the results of step (j).

4. The process of claim 3, wherein step (i) is performed by:
   i1) decomposing a selected local image into a set of oriented segments defining a function;
   and wherein step (j) is performed by:
   j1) computing a difference between the selected local image function and a function of a local image of a class.

5. The process of claim 3, further including steps of:
   l) defining a plurality of first pattern points along a first axis normal to a boundary of the mask defining the feature;
   m) calculating a diffusion shift of a photoresist based on a process light intensity at each pattern point; and
   n) shifting the boundary of the mask a distance along the first axis based on the diffusion shift.

6. The process of claim 5, further including the step:
   o) defining a plurality of second pattern points along a second axis parallel to the boundary;
   and wherein step (m) includes steps of:
   m1) calculating first and second subsidiary values based on the light intensities at each pattern point; and
   m2) calculating the diffusion shift based on the first and second subsidiary values.

7. The process of claim 1, further including steps of:
   l) defining a plurality of first pattern points along a first axis normal to a boundary of the mask defining the feature;
   m) calculating a diffusion shift of a photoresist based on a process light intensity at each pattern point; and
   n) shifting the boundary of the mask a distance along the first axis based on the diffusion shift.

8. The process of claim 7, further including the step:
   o) defining a plurality of second pattern points along a second axis parallel to the boundary;
   and wherein step (m) includes steps of:
   m1) calculating first and second subsidiary values based on the light intensities at each pattern point; and
   m2) calculating the diffusion shift based on the first and second subsidiary values.

9. A process of designing a mask for use in a photolithographic process to form a predetermined feature on a substrate, the process comprising steps of:
   a) defining a mask for use in the photolithographic process, wherein the mask has at least one boundary matching a boundary of the feature;
   b) defining a plurality of local images of mask boundaries, each local image having a function;
   c) defining a plurality of classes of local images having similar function sets;
   d) identifying a function associated with a selected local image;
   e) comparing the function of the selected local image to the function set of a class of local images; and
   f) assigning the selected local image to a class based on the results of step (e).

10. The process of claim 9, wherein step (f) is performed by:
    f1) assigning the selected local image to a class having the most similar function to the selected local image if the similarity meets a predetermined threshold; and
    f2) creating a new class centered on the selected local image if the similarity does not meet the predetermined threshold.

11. The process of claim 9, wherein step (d) is performed by:
    d1) decomposing a selected local image into a set of oriented segments defining a function;
    and wherein step (e) is performed by:
    e1) computing a difference between the selected local image function and a function of a local image of a class.

12. The process of claim 9, further including steps of:
    g) correcting the boundary of one local image of each class; and
    h) applying the corrections of step (g) to all other local images of the class.

13. The process claim 9, further including steps of:
    i) defining a plurality of first pattern points along a first axis normal to a boundary of the mask defining the feature;
    j) calculating a diffusion shift of a photoresist based on a process light intensity at each pattern point; and
    k) shifting the boundary of the mask a distance along the first axis based on the diffusion shift.

14. The process of claim 13, further including the step:
    l) defining a plurality of second pattern points along a second axis parallel to the boundary;
    and wherein step (j) includes steps of:
    j1) calculating first and second subsidiary values based on the light intensities at each pattern point; and j2) calculating the diffusion shift based on the first and second subsidiary values.

15. A process of designing a mask for use in a photolithographic process to form a predetermined pattern in a photoresist on a substrate using a process light intensity, the pattern representing a feature being formed on the substrate, the process comprising steps of:
   a) defining a plurality of first pattern points along a first axis normal to a boundary of the mask defining the feature;
   b) calculating a diffusion shift of a photoresist based on a process light intensity at each pattern point; and
   c) shifting the boundary of the mask a distance along the first axis based on the diffusion shift.

16. The process of claim 15, further including the step:
   d) defining a plurality of second pattern points along a second axis parallel to the boundary;
   and wherein step (b) includes steps of:
   b1) calculating first and second subsidiary values based on the light intensities at each pattern point; and
   b2) calculating the diffusion shift based on the first and second subsidiary values.

17. The process of claim 15, further including the step of:
   d) defining a plurality of second pattern points along a second axis parallel to the boundary;
   and wherein step (b) includes steps of:
   b1) calculating a first subsidiary value, $z_x$ based on weighted averages and weighted differences of the light intensities at each of the first plurality of pattern points;
   b2) calculating a second subsidiary value, $z_y$, based on weighted averages and weighted differences of the light intensities at each of the second plurality of pattern points; and
   b3) calculating the diffusion shift based on the first and second subsidiary values and a parameter of diffusion, $S_{dif}$, associated with the photoresist.

18. The process of claim 17, further including steps of:
   e) identifying a distance, $d_x$, between first pattern points and a distance, $d_y$, between second pattern points;
   f) calculating a value, $$z_x^G,$$

based and $z_x$;
   and wherein step (b3) includes:
   b3a) calculating $S_{dif}$ based on a first relationship of $d_x z_y$ if $d_y z_y > 3 S_{dif}$ and $$d_x z_x^G > 3 S_{dif};$$

b3b) calculating $S_{dif}$ based on a second relationship of $d_x z_y$ if $d_y z_y > 3 S_{dif}$ and $$d_x z_x^G < 3 S_{dif};$$

b3c) calculating $S_{dif}$ based on a third relationship of $d_x z_y$ if $d_y z_y > 3 S_{dif}$ and $$d_x z_x^G > 3 S_{dif};$$

b3d) calculating $S_{dif}$ based on a fourth relationship of $d_x z_y$ if $d_y z_y > 3 S_{dif}$ and $$d_x z_x^G < 3 S_{dif}.$$

19. A computer useable medium having a computer readable program embodied therein for addressing data to cause a computer to design a mask for use in a photolithographic process to form a predetermined feature on a substrate using a process light intensity, the computer readable program in the computer useable medium comprising:
   first computer readable program code for causing the computer to define a mask for use in the photolithographic process, wherein the definition of the mask includes a definition of at least one boundary matching a boundary of the feature;
   second computer readable program code for causing the computer to identify a definition of a location of the process light intensity relative to the definition of the mask boundary;
   third computer readable program code for causing the computer to segment the definition of the mask boundary into a plurality of regions, with each region having a defined midpoint;
   fourth computer readable program code for causing the computer to calculate a distance $\Delta$ normal to the definition of the boundary in each region between the definitions of the respective region midpoint and the location of the process light intensity;
   fifth computer readable program code for causing the computer to identify if the definition of the mask includes a close connection exists relative to the respective region; and
   sixth computer readable program code for causing the computer to move the definition of the respective region a distance $\Delta'$ based on the distance $\Delta$ and the identification of any close connection.

20. The computer useable medium of claim 19, wherein the sixth computer readable program code includes:
   seventh computer readable program code for causing the computer to move the mask boundary within the region by $\Delta$ if a close connection is not found to exist; and
   eighth computer readable program code for causing the computer to move the mask boundary within the region by $\Delta/(1+P)$ if a close connection is found to exist.

21. A computer useable medium having a computer readable program embodied therein for addressing data to cause a computer to design a mask for use in a photolithographic process to form a predetermined feature on a substrate, the computer readable program in the computer useable medium comprising:
   first computer readable program code for causing the computer to define a mask for use in the photolithographic process, wherein the mask definition includes a definition of at least one boundary matching a boundary of the feature;
   second computer readable program code for causing the computer to define a plurality of local images of mask boundaries, each local image having a functional definition;
   third computer readable program code for causing the computer to define a plurality of classes containing definitions of local images having similar functional sets;
   fourth computer readable program code for causing the computer to identify a functional definition associated with a selected local image;
   fifth computer readable program code for causing the computer to compare the functional definition of the selected local image to the functional set of a class of local images; and
   sixth computer readable program code for causing the computer to assign the definition of the selected local image to a class based on a similarity of the functional definition of the selected local image to the functional set of the class.

22. The computer useable medium of claim 21, wherein the sixth computer readable code includes:
seventh computer readable program code for causing the computer to assign the definition of the selected local image to the class having the most similar functional definition to that of the selected local image if the similarity meets a predetermined threshold; and
eighth computer readable program code for causing the computer to create a new class having a functional definition based on that of the selected local image if the similarity does not meet the predetermined threshold.

23. The process of claim 21, wherein the fourth computer readable program code includes:
ninth computer readable program code for causing the computer to decompose the definition of the selected local image into a set of oriented segments defining a function;
and wherein the fifth computer readable program code includes:
eleventh computer readable program code for causing the computer to compute a difference between the function of the selected local image and a function of a local image of a class.

24. The computer useable medium of claim 21, further including:
twelfth computer readable program code for causing the computer to correct the boundary definition of one local image of each class; and
thirteenth computer readable program code for causing the computer to applying the corrected boundary definitions to all other local images of the class.

25. A computer useable medium having a computer readable program embodied therein for addressing data to cause a computer to design a mask for use in a photolithographic process to form a predetermined pattern in a photoresist on a substrate using a process light intensity, the pattern representing a feature being formed on the substrate, the computer readable program in the computer useable medium comprising:
first computer readable program code for causing the computer to define a plurality of first pattern points along a first axis normal to a definition of a boundary of the mask defining the feature;
second computer readable program code for causing the computer to calculate a diffusion shift of the photoresist based on the light intensities at each pattern point; and
third computer readable program code for causing the computer to shift the definition of the boundary a distance along the first axis based on the diffusion shift.

26. The computer useable medium of claim 25, further including:
fourth computer readable program code for causing the computer to define a plurality of second pattern points along a second axis parallel to the boundary definition;
and wherein the second computer readable program code includes:
fifth computer readable program code for causing the computer to calculate first and second subsidiary values based on the light intensities at each pattern point; and
sixth computer readable program code for causing the computer to calculate the diffusion shift based on the first and second subsidiary values.

27. The computer readable medium of claim 25, further:
fourth computer readable program code for causing the computer to define a plurality of second pattern points along a second axis parallel to the boundary definition; and wherein the second computer readable program code includes:
fifth computer readable program code for causing the computer to calculate a first subsidiary value, $Z_x$, based on weighted averages and weighted differences of the light intensities at each of the first plurality of pattern points;
sixth computer readable program code for causing the computer to calculate a second subsidiary value, $z_y$, based on weighted averages and weighted differences of the light intensities at each of the second plurality of pattern points; and
seventh computer readable program code for causing the computer to calculate the diffusion shift based on the first and second subsidiary values and a parameter of diffusion, $S_{dif}$, associated with the photoresist.

28. The computer useable medium of claim 27, wherein the computer readable program further includes:
eighth computer readable program code for causing the computer to define a distance, $d_x$, between first pattern points and a distance, $d_y$, between second pattern points,
ninth computer readable program code for causing the computer to calculate a value $$z_x^G,$$

based on $z_x$;
and wherein the seventh computer readable program code includes:
computer readable program code for causing the computer to calculate $S_{dif}$ based on a first relationship of $d_x z_y$ if $d_y z_y > 3S_{dif}$ and $$d_x z_x^G > 3S_{dif};$$

computer readable program code for causing the computer to calculate $S_{dif}$ based on a second relationship of $d_x z_y$ if $d_y z_y > 3S_{dif}$ and $$d_x z_x^G < 3S_{dif};$$

computer readable program code for causing the computer to calculate $S_{dif}$ based on a third relationship of $d_x z_y$ if $d_y z_y < 3S_{dif}$ and $$d_x z_x^G > 3S_{dif};$$

and
computer readable program code for causing the computer to calculate $S_{dif}$ based on a fourth relationship of $d_x z_y$ if $d_y z_y 3S_{dif}$ and $$d_x z_x^G < 3S_{dif}.$$

* * * * *